United States Patent
Chi

(10) Patent No.: US 6,552,397 B1
(45) Date of Patent: Apr. 22, 2003

(54) CHARGE PUMP DEVICE FORMED ON SILICON-ON-INSULATOR AND OPERATION METHOD

(75) Inventor: Min-hwa Chi, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 12 days.

(21) Appl. No.: 09/602,401

(22) Filed: Jun. 23, 2000

(51) Int. Cl.[7] .............................................. H01L 29/72
(52) U.S. Cl. ....................... 257/347; 257/314; 257/355; 257/371; 257/392; 257/393; 257/544
(58) Field of Search ................................ 257/392, 393, 257/347, 314, 355, 371, 544

(56) References Cited

U.S. PATENT DOCUMENTS 6,040,610 A * 3/2000 Noguchi et al. ............ 257/392

* cited by examiner

Primary Examiner—Edward Wojciechowicz
(74) Attorney, Agent, or Firm—Blakely, Sokoloff, Taylor & Zafman LLP

(57) ABSTRACT

A charge pump formed in a silicon-on-insulator (SOI) substrate is disclosed. The charge pump comprises a SOI layer formed on a substrate. Formed in the silicon of the SOI is a first p-body and a second p-body. Also formed in the silicon is a n+ region that extends down to the insulator so that the n+ region separates the first p-body and second p-body. Finally, a gate structure is formed atop of a portion of the first p-body and a portion of the n+ region. The gate structure is separated from the $1^{st}$ p-body and n+ region by gate oxide, and it serves as charge pump capacitor. Both the diode turn-on (when gate is pulsing high and forward biasing the p-body to n+ junction), and GIDL current (when the gate is pulsing low, and generates GIDL hole currents from n+ surface to p-body) will result in a "short" of the p-body and n+ region; this ensures the proper operation of charge pump.

20 Claims, 10 Drawing Sheets

CHARGE PUMP DEVICE FORMED ON SILICON-ON-INSULATOR AND OPERATION METHOD

TECHNICAL FIELD OF THE INVENTION

The present invention relates to charge pumps, and more particularly, to a charge pump formed on a silicon-on-insulator substrate.

BACKGROUND OF THE INVENTION

A prior art charge pump formed using MOS technology is shown in FIG. 1A. An n-channel MOS transistor with a diode configuration (i.e. drain and gate shorted with body grounded) serves as a diode. The voltage drop of the "diode" (also referred to as "turn-on" voltage) is simply the transistor threshold voltage ($V_t$) with body bias of source side. Although an ideal $V_t$ of the n-MOS should be 0 volts, native n-channel transistors (i.e. transistor without $V_t$ implant as in typical transistors) are used in practical charge pump circuits. As seen in FIG. 1C, the clock ($\phi_1$) pumps charge to the output node A and boosts it's potential higher than the clock by ($V_{cc}-V_t$). This charge pump can be used as word-line driver in DRAM or flash memory.

FIG. 1B shows that the equivalent circuit of such a charge pump building block is a diode (with turn-on voltage $V_t$) connected to a capacitor. Typically the capacitance ($C_{pump}$) is much larger than other stray capacitances at node A, so that the full pulse height can be "pumped" to node A.

A prior art 2-phase two stage charge pump circuit is shown in FIG. 2A by using 2 building blocks and pumped by 2 non-overlap clocks. The voltage waveform at node A is still a boosted level of the clock $\Phi_1$ by ($V_{cc}-V_t$) as illustrated in FIG. 1. As seen in FIG. 2C, as the first clock $\phi_1$ pulses high, transistor $N_1$ is off and $N_2$ is on, thus node B is charged to ($2V_{cc}-V_t$). As $\phi_1$ is pulsing down, $N_2$ is off. As $\phi_2$ is pulsing up (shortly after $\phi_1$ pulsing down due to the nature of non-overlap clocks), node B reaches ($3V_{cc}-2V_t$). After this initial cycle, the voltage waveform at node B follows clock $\phi_2$ with boosted levels and between boosted levels by $2(V_{cc}-V_t)$, i.e. oscillating in between $2(V_{cc}-V_t)$ and $V_{cc}+2(V_{cc}-V_t)$. The equivalent circuit diagram of FIG. 2A is shown in FIG. 2B.

The illustration above is a simplified case when the output current load is negligible. In real circuit applications, the output of a charge pump circuit may need to drive other circuits with boosted stable DC level. A realistic charge pump may need many stages of charge pump with large enough (pumping) capacitors as well as an output rectifier. Such a charge pump is shown in FIG. 3A, which is a two-phase multi stage charge pump. FIG. 3B shows the timing diagram for the 2 phase non-overlap clock signals input to the charge pump. The output rectifier typically consist of capacitors and resistors (not shown in FIG. 3A). The driving capability of the charge pump depends on several characteristics of the devices, such as transistor size, $V_t$, the magnitude of capacitance, clocking pulse height and frequency, and the number of charge pumping stages. The output rectifier serves to maintain a stable DC level for load circuits. The output voltage can be boosted to a high voltage level, which is limited by junction breakdown.

The implementation of such charge pumping circuits of FIGS. 1, 2, and 3 by CMOS technology is well known. The n-channel transistors in the charge pump needs to sustain high voltage across the gate oxide and source/drain junctions and also need a low enough threshold voltage ($V_t$) for minimizing the "diode" drop during operation. Native n-channel transistors (i.e. transistor without $V_t$ implant as required in typical transistors) are used in practical charge pump circuits. The "pumping" capacitor is typically large in area and implemented by a poly-to-poly structure with dielectric thickness of 300A to 500A or metal-to-metal with a thicker dielectric (~1000A to 2000A). A typical charge pump circuit implemented on VLSI is relatively large due mainly to the large capacitor area required for pumping enough charge to supply the load current (e.g. several hundreds of mA) to high-voltage circuits.

Integrated circuits fabricated on silicon-on-insulator (SOI) wafers is useful for applications in high speed, low power, and high voltage. A direct implementation of the CMOS charge pumps described above is very difficult, especially on SOI wafers with a thin silicon layer (for fully depleted transistors). First, the body of each transistor is not grounded and is left floating. The leakage current in a transistor with floating body is large during off-state due to the parasitic npn bipolar transistor (i.e. n+-source, p-body, and n+-drain) with the floating body as base. This leakage current will degrade the efficiency of the charge pump significantly.

DETAILED DESCRIPTION

The present invention discloses a charge pump implementation on SOI. In the charge pump, capacitors are formed using the gate oxide, instead of a poly-to-poly or metal-to-metal capacitors. This reduces the area by at least a factor of ten due to the gate oxide's small thickness. Further, gate induced drain leakage (GIDL) current is used as a switching mechanism, rendering transistor diodes unnecessary. Therefore, the floating body effect is eliminated. The SOI having a thin silicon layer also provides the required isolation of the junction. Finally, there is no need of metal contacts and connections for the gate to drain/source and capacitors.

Figure 4A:
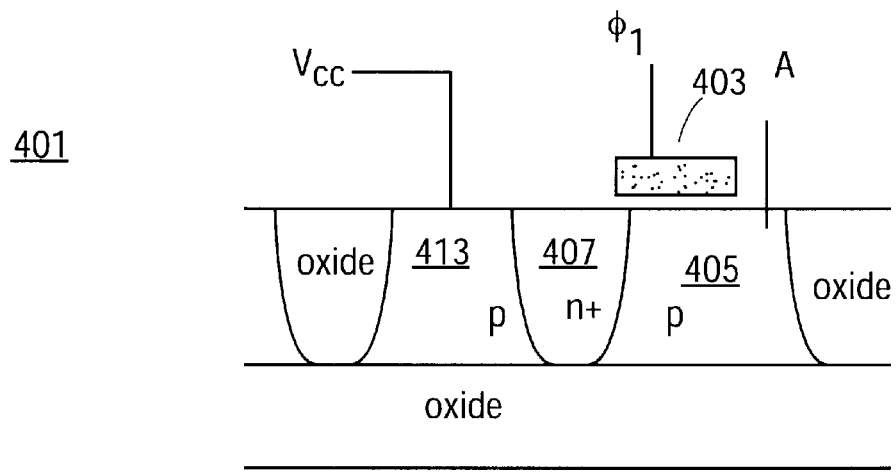
FIGS. 4A–4C illustrate a charge pump formed on SOI in accordance with the present invention.
Figure 4B:
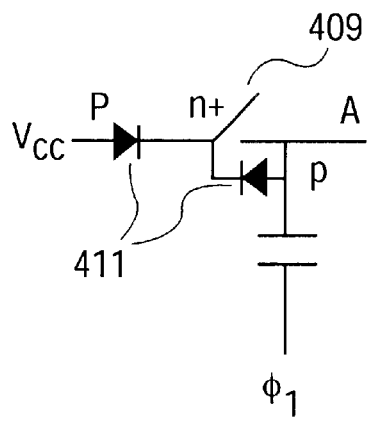

A gated p/n+/p structure on SOI can serve as a simple charge pump 401, as shown in FIG. 4. A polysilicon gate 403 formed on top of a portion of p-body 405 (and slightly over an n+ junction 407) forms a capacitor for pumping charge, as shown in the equivalent circuit in FIG. 4B. The polysilicon gate 403 is separated from the portion of p-body 405 by a gate oxide. The capacitor formed by the polysilicon gate 403 to n+ junction 407 typically consumes much smaller silicon area than that of the prior art formed on a bulk silicon wafer. The polysilicon gate 403 can trigger GIDL hole current at the surface of n+ 407 overlap underneath the poly gate 403 to the portion of p-body 405 junction when the polysilicon gate 403 is biased to low (e.g. 0 volts). This is represented as a switch 409 in FIG. 4B, which is activated by the poly gate 403 biased low. The diodes 411 in FIG. 4B represents the parasitic p/n+ (with p connecting to the input $V_{cc}$) and n+/p (with the portion of p-body 405 connecting to the output node A) junctions.

Figure 5A:
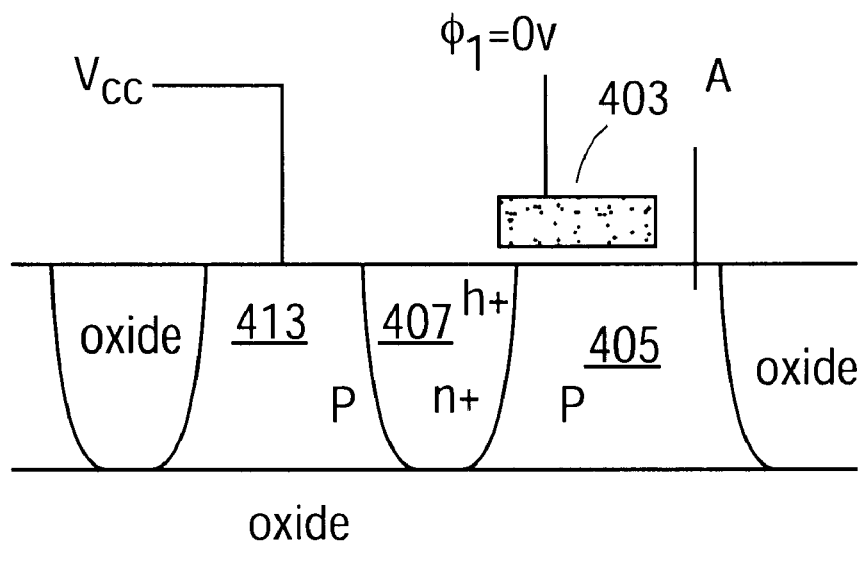
FIGS. 5A–5B illustrate the operation of the charge pump of FIG. 4 when the GIDL current is triggered and when the p/n+junction is turned on due to coupling by the capacitor.
Figure 5B:
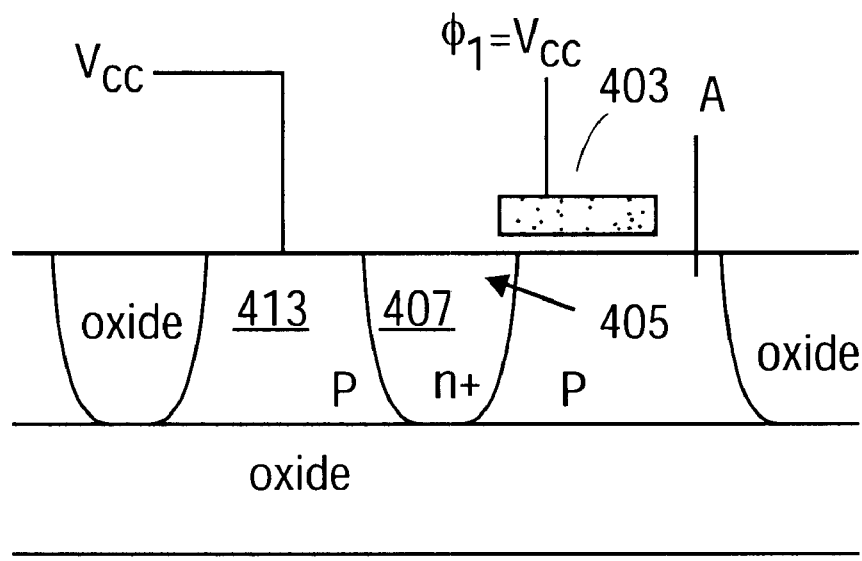

The role of the "GIDL" switch 409 and the diodes 411 (connected to output node A) simply serves as a "short" to maintain equal potential of the n+ 407 and p-body 405 (connected to node A) without physical short by metal and contacts. As illustrated in FIG. 5A, if the clock signal $\phi_1$ is pulsing low (e.g. 0v), holes are generated at the surface of n+ 407 and polysilicon gate 403 overlap area (by the band-to-band tunneling mechanism), then these holes flow into the portion of the p-body 405 as GIDL current. This GIDL current pulls the portion of the p-body 405 potential equal to the n+ 407 potential. Turning to FIG. 5B, if the clock signal $\phi_1$ is pulsing high (e.g. $V_{cc}$~3.3v), then the portion of the p-body 405 is biased at a higher potential (by capacitance coupling to the gate 403) and the n+/p junction is turned on so that the portion of the p-body 405 potential is equal to the n+ 407 potential. Thus, no matter what the clock polarity, there is a conducting mechanism between the n+ 407 and p-body 405 (connecting to node A).

Figure 1A:
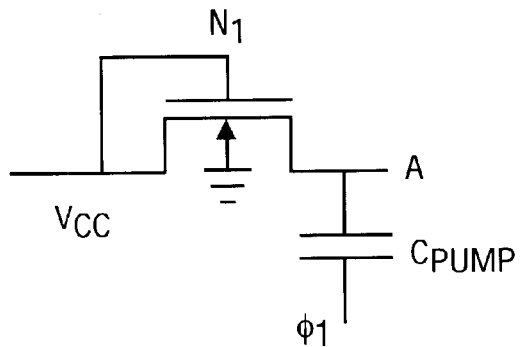
FIGS. 1A–1C illustrate a prior art charge pump circuit based on MOS technology.
Figure 4C:
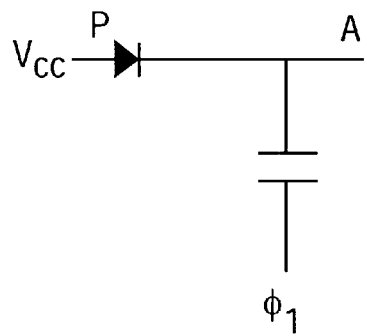

The equivalent circuit in FIG. 4B simply becomes FIG. 4C, which is the same as the equivalent circuit of a conventional charge pump building block shown in FIG. 1A.

Figure 6A:
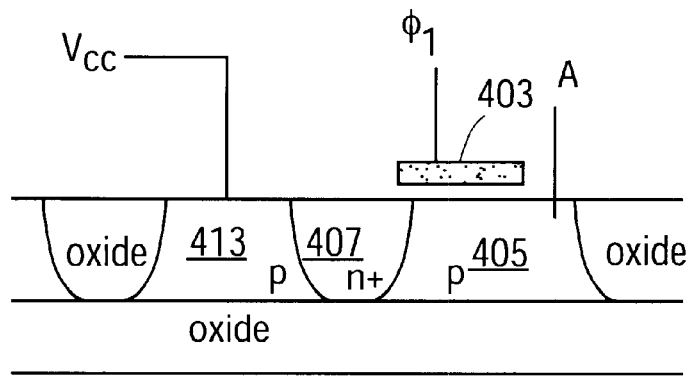
FIGS. 6A–6C illustrate in detail the operation of the charge pump of FIG. 4.
Figure 6B:
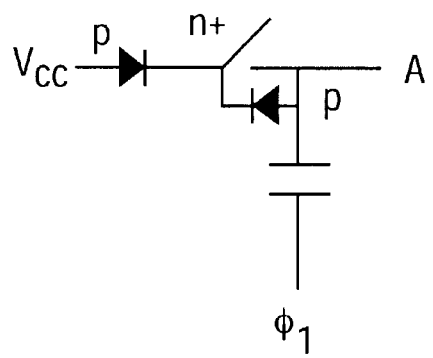
Figure 6C:
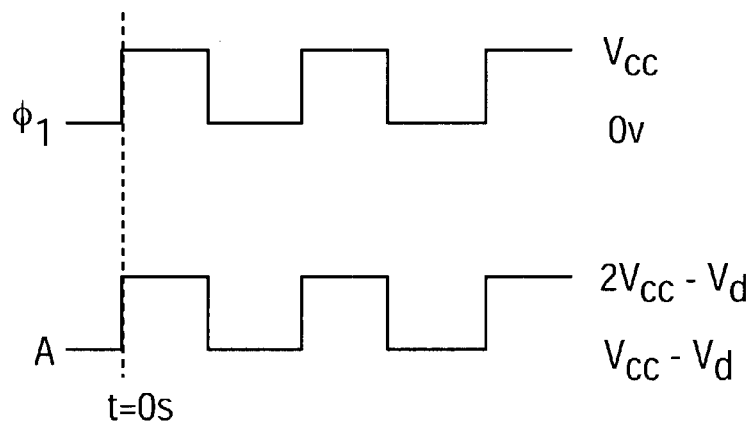

The operation of the charge pump of FIG. 4A is further illustrated in FIGS. 6A–6C. As seen in FIG. 6C, before t=0 sec, the n+ 407 potential is close to $V_{cc}$ (i.e. $V_{cc}-V_d$), as pulled by a second portion of the p-body 413 (connected to $V_{cc}$). Note that the "diode" drop $V_d$ from the p-body 413 (input node) to n+ region 407, depending on the magnitude of current flowing, is in the range of 0 volts to ~0.7 volts. Also, before t=0 sec, the clock $\phi_1$ is low and the "GIDL" switch is on for the holes on the surface of the n+region 407 flowing into the p-body 405 (node A) to pull its potential to $\sim(V_{cc}-V_d)$.

Figure 1B:
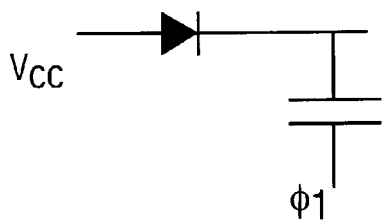
Figure 1C:
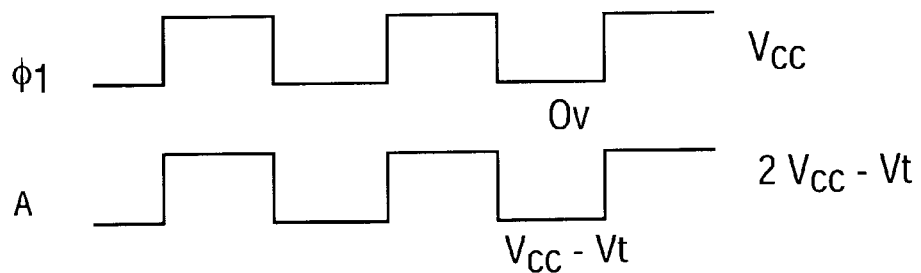
Figure 2A:
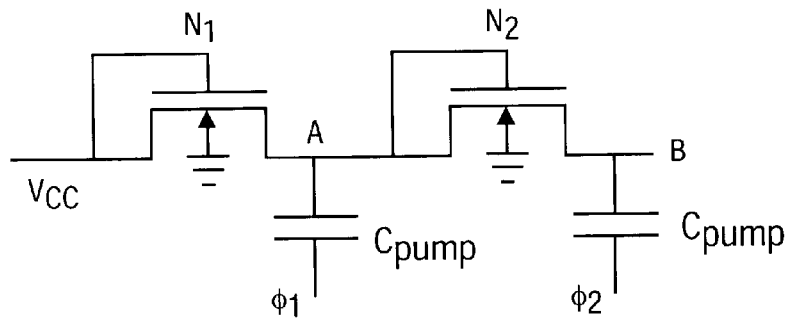
FIGS. 2A–2C illustrate a prior art two-phase two-stage charge pump pumped by 2 non-overlap clocks.
Figure 2B:
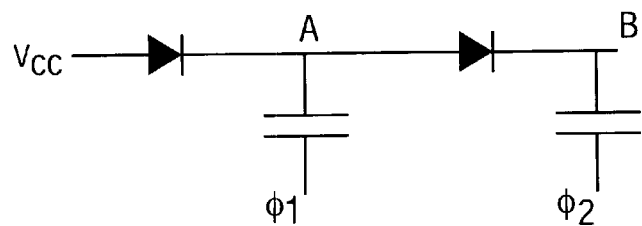
Figure 2C:
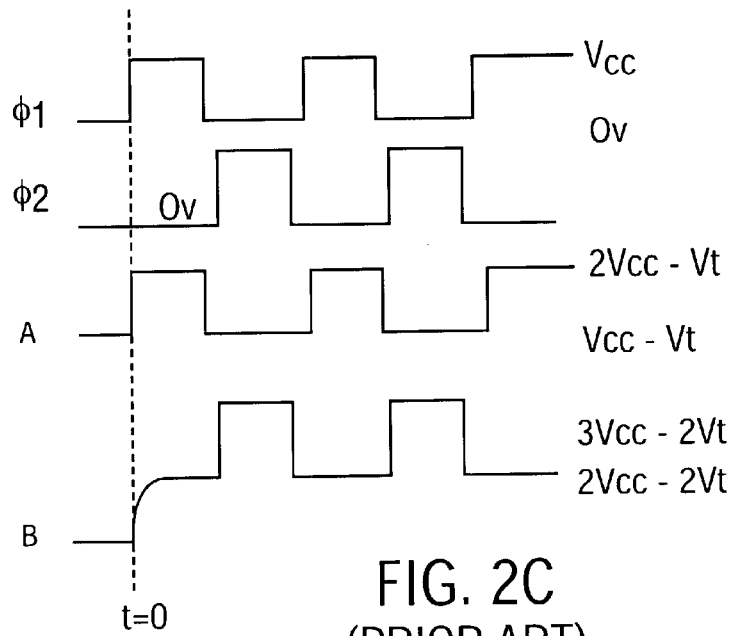
Figure 3A:
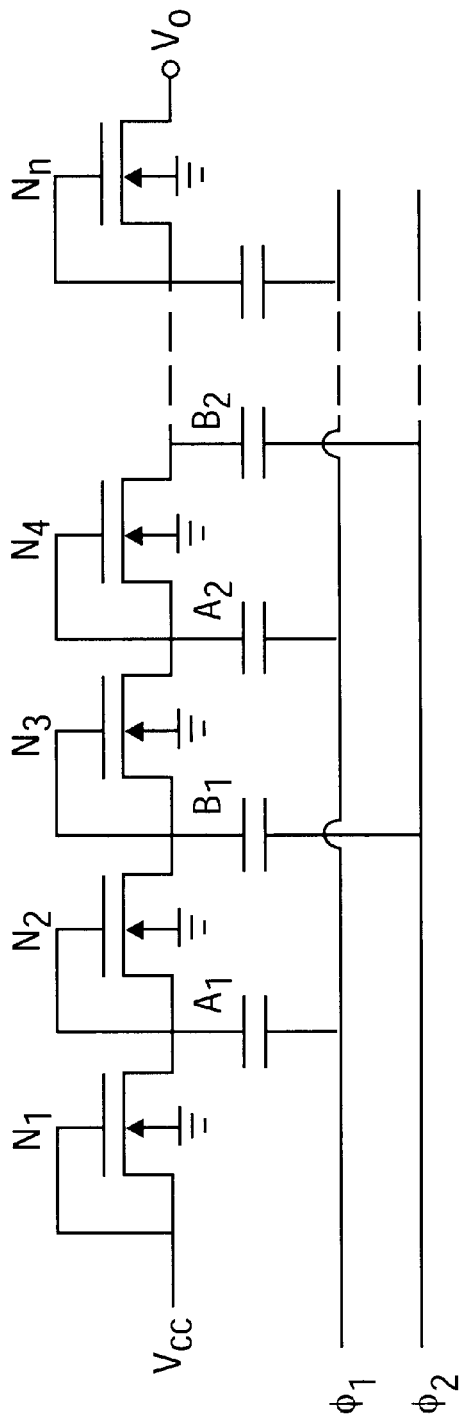
FIGS. 3A–3B illustrate a prior art two-phase multi-stage charge pump.
Figure 3B:
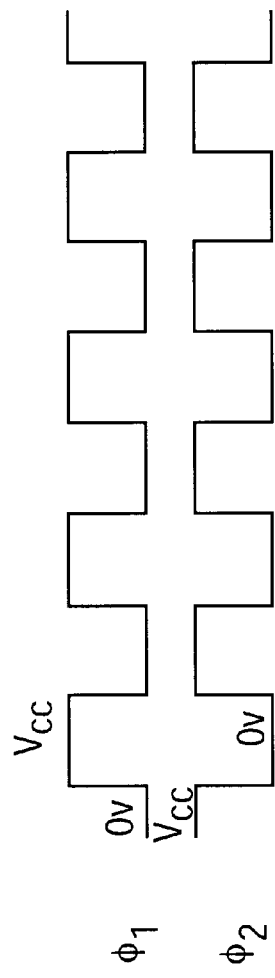

After t=0 sec, the clock signal +, is pulsed high, the p-body 405 (of node A) is capacitively coupled and pumped to $\sim(2V_{cc}-V_d)$. Also, the n+ region 407 potential is clamped to $\sim(2V_{cc}-V_d)$ by the turn on of the n+/p-body 405 (node A) junction. When the clock $\phi_1$ pulls to low again, the p-body 405 (node A) potential is back to $(V_{cc}-V_d)$, and so is the n+ node 407 by the turn on of GIDL switch. Notice that the voltage waveform at output node A (see FIG. 6C) is similar to that in the prior art charge pump building block circuit in FIG. 1.

Figure 7A:
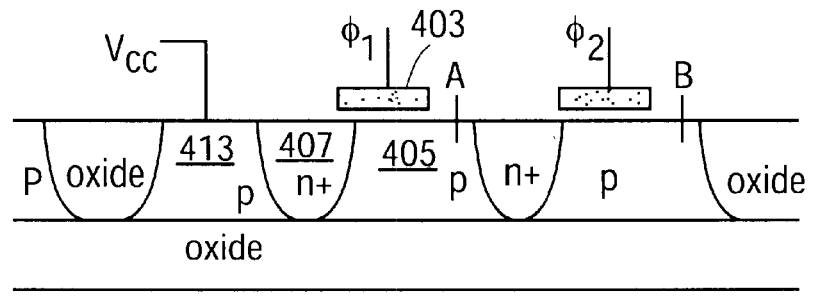
FIGS. 7A–7C illustrate the operation of a two-phase charge pump formed in accordance with the present invention.
Figure 7B:
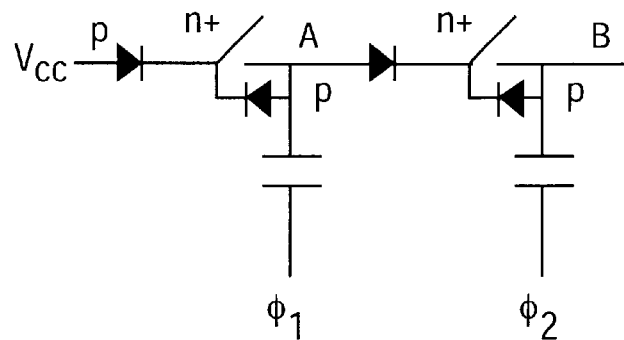
Figure 7C:
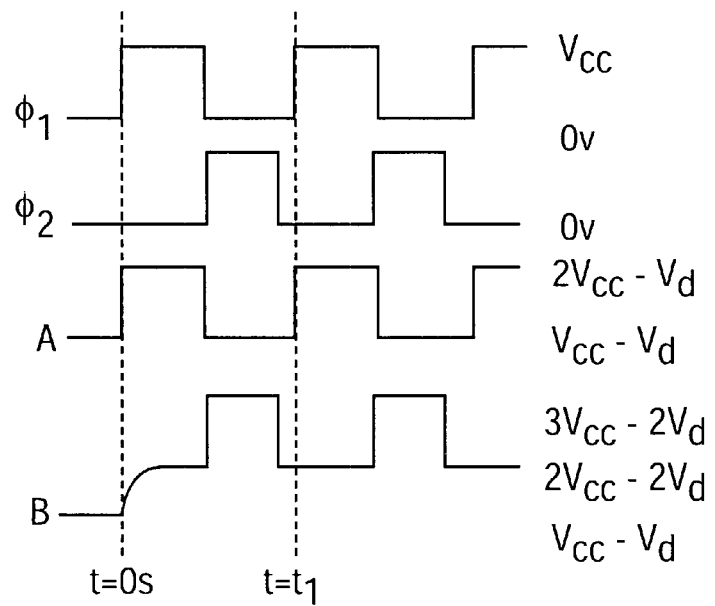

Turning to FIGS. 7A–7C, the operation of a pair of charge pumps formed in accordance with the present invention is shown. The 2-phase clock is non-overlap. The voltage waveform at node A is a boosted level of the clock $\phi_1$ by $(V_{cc}-V_d)$ as already detailed in FIGS. 6A–6C. Before t=0 sec, both node A and node B are maintained at level $(V_{cc}-V_d)$ as clamped by the input node 413 (biased at $V_{cc}$) junction and the GIDL currents. At t=0+ sec, $\phi_1$ is pulsing to high and node A is charging to $(2V_{cc}-V_d)$ by capacitive coupling as described above. Since clock $\phi_2$ is low, the GIDL switch is on and the node B is also charging to the same potential as node A, i.e. $(2V_{cc}-V_d)$. As $\phi_1$ is pulsing to 0v, node A is back to $(V_{cc}-V_d)$. As $\phi_2$ is pulsing high (shortly after $\phi_1$ pulsing down due to the nature of non-overlap clocks), node B reaches $3V_{cc}-2V_d$. After this initial cycle, the voltage waveform at node B reaches steady-state and follows the clock $\phi_2$ with boosted level by $2(V_{cc}-V_t)$, i.e. oscillating in between $2(V_{cc}-V_t)$ and $V_{cc}+2(V_{cc}-V_t)$.

Figure 8A:
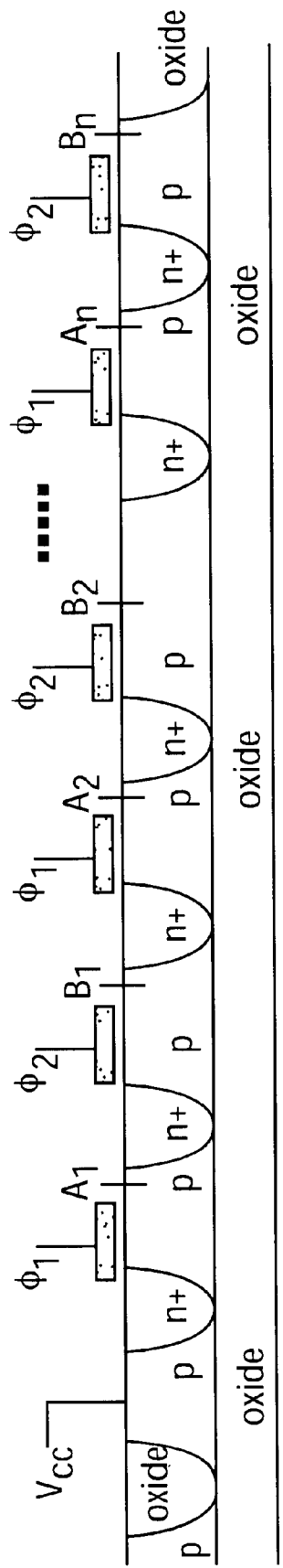
FIGS. 8A–8C is cross-sectional view of a multi-stage 2-phase charge pump circuit formed on SOI in accordance with the present invention.
Figure 8B:
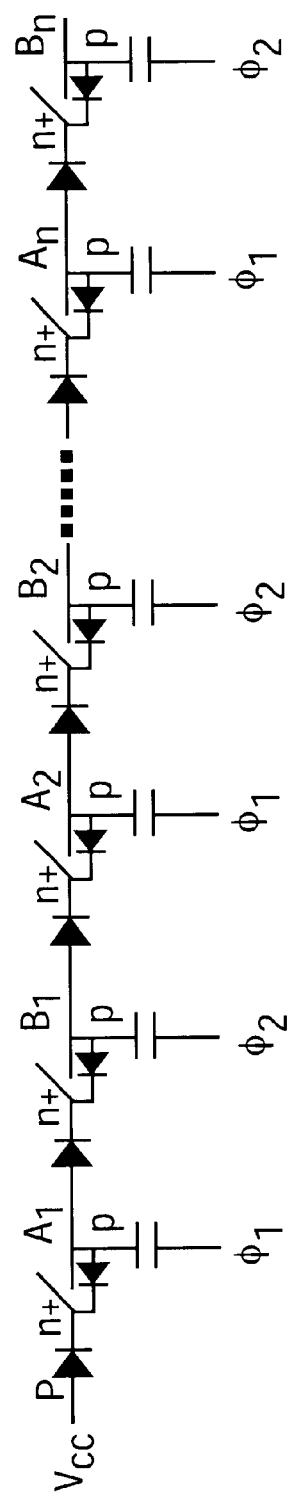
Figure 8C:
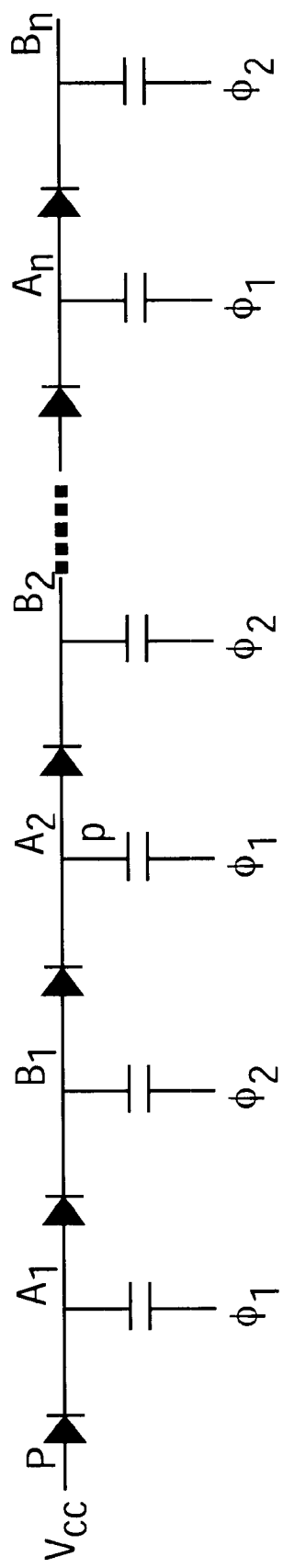

In real circuit applications, the output of a charge pump circuit may need to drive other circuits with boosted stable DC level. A realistic charge pump may need many stages of charge pump with large enough (pumping) capacitors, as well as output rectifier. This is shown if FIGS. 8A–8C, which includes multiple stages. The driving capability of the new charge pump on SOI depends on several factors of devices, such as, the magnitude of GIDL current, the magnitude of capacitance, clocking pulse height and frequency, and number of charge pumping stages. The output rectifier (not shown in FIGS. 8A–8C) serves to maintain stable DC level for load circuits. The output voltage can be boosted to a high (positive) voltage level limited by junction breakdown and the gate oxide breakdown. FIG. 8A shows a configuration of an n-stage 2-phase charge pumping circuits. Notice that there are no metal contacts needed in the building blocks except at the input and output nodes.

Note that if the final output voltage is designed to be high, then the gate oxide of the capacitors in the building blocks close to the output must be thick enough to avoid gate oxide breakdown. In current CMOS technology, it is possible to manufacture an integrated circuit having multiple gate oxide thicknesses, e.g. a thin oxide for logic transistors and a thicker oxide for I/O circuits.

Figure 9A:
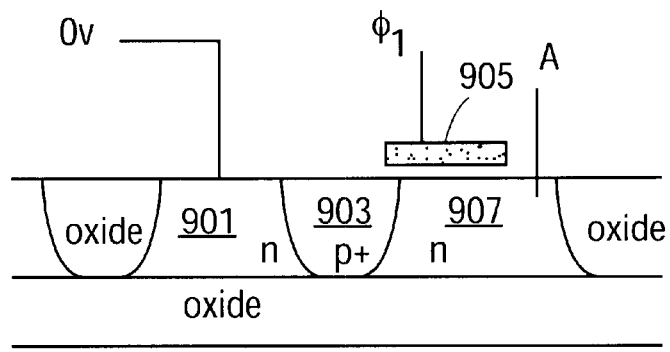
FIGS. 9A–9C illustrate a charge pump formed on SOI in accordance with the present invention that generates a negative voltage.
Figure 9B:
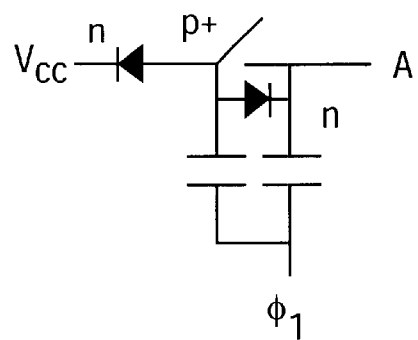
Figure 9C:
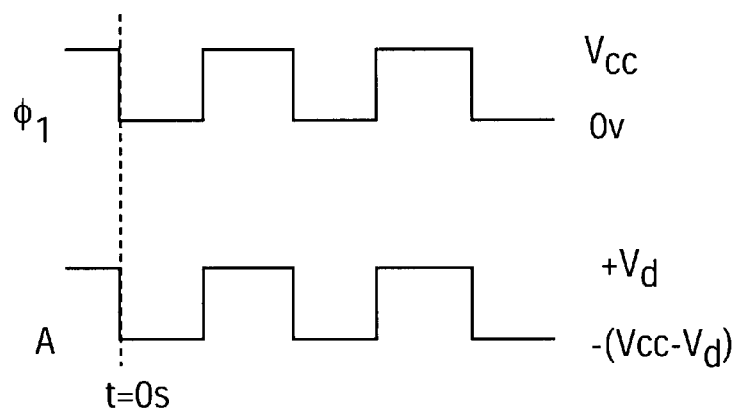

Turning to FIGS. 9A–9C, it can be seen that if the charge pump is to drive a negative voltage, the dopant types are switched from the embodiment shown in FIG. 4. Thus, the input contact 901 and output node A 907 is n-type and the p+ region 903 is p-type. The gate 905 is formed from polysilicon.

While the preferred embodiment of the invention has been illustrated and described, it will be appreciated that various changes can be made therein without parting from the spirit of scope of the invention. The current invention has been described in relation to a preferred embodiment. One of ordinary skill after reading the foregoing specification will be able to affect various changes, alterations, and substitutions or equipment without departing from the broad concepts disclosed. It is therefore intended that the scope with the Letters Patent granted hereon be limited only by the definition contained in the affirmative claims and the equivalents thereon, and not by limitations of the embodiments described herein.

What is claimed is:

1. A charge pump formed in a silicon-on-insulator (SOI) substrate comprising:

a substrate;

an insulator formed on said substrate;

a semiconductor layer formed on said insulator;

a first p-body formed in said semiconductor layer;

a second p-body formed in said semiconductor layer;

a n+ region formed in said semiconductor layer extending down to said insulator, said n+ region separating said first p-body and said second p-body; and a gate structure formed atop a portion of said first p-body and only a portion of said n+ region, said gate structure over said first p-body and said n+ region forming a switch, said n+ region and said first p-body forming a first diode, said n+ region and said second p-body forming a second diode, said gate structure formed from a thin gate oxide layer underneath a conductive layer.

2. The charge pump of claim 1 wherein said first and second p-body extends through said semiconductor layer to said insulator.

3. The charge pump of claim 1 wherein said n+ region extends through said semiconductor layer to said insulator.

4. The charge pump of claim 1 wherein a clock signal is applied to said gate structure.

5. The charge pump of claim 1 wherein an output node is connected to said first p-body and an input node is connected to said second p-body.

6. The charge pump of claim 1 further including:
a second n+ region formed in said semiconductor layer and extending down to said insulator, said second n+ region being positioned so that said first p-body is between said n+ region and said second n+ region;
a third p-body formed in said semiconductor layer and extending down to said insulator, said third p-body being positioned so that said second n+ region is between said first p-body and said third p-body; and
a second gate structure formed atop a portion of said third p-body and a portion of said second n+ region, said gate structure formed from a second thin gate oxide layer underneath a second conductive layer.

7. The charge pump of claim 6 wherein a second clock signal is applied to said second gate structure.

8. The charge pump of claim 6 wherein an output node is connected to said third p-body and an input node is connected to said second p-body.

9. A charge pump formed in a silicon-on-insulator (SOI) substrate comprising:
a substrate;
an insulator formed on said substrate;
a semiconductor layer formed on said insulator;
a first n-body formed in said semiconductor layer;
a second n-body formed in said semiconductor layer
a p+ region formed in said semiconductor layer extending down to said insulator, said p+ region separating said first n-body and said second n-body; and
a gate structure formed atop a portion of said first n-body and only a portion of said p+ region, said gate structure over said first n-body and said p+ region forming a switch, said p+ region and said first n-body forming a first diode, said p+ region and said second n-body forming a second diode, said gate structure formed from a thin gate oxide layer underneath a conductive layer.

10. The charge pump of claim 9 wherein said first and second n-body extends through said semiconductor layer to said insulator.

11. The charge pump of claim 9 wherein said p+ region extends through said semiconductor layer to said insulator.

12. The charge pump of claim 9 wherein a clock signal is applied to said gate structure.

13. The charge pump of claim 9 wherein an output node is connected to said first n-body and an input node is connected to said second n-body.

14. The charge pump of claim 9 further including:
a second p+ region formed in said semiconductor layer and extending down to said insulator, said second p+ region being positioned so that said first n-body is between said p+ region and said second p+ region;
a third n-body formed in said semiconductor layer and extending down to said insulator, said third n-body being positioned so that said second p+ region is between said first n-body and said third n-body; and
a second gate structure formed atop a portion of said third n-body and a portion of said second p+ region, said gate structure formed from a second thin gate oxide layer underneath a second conductive layer.

15. The charge pump of claim 14 wherein a second clock signal is applied to said second gate structure.

16. The charge pump of claim 14 wherein an output node is connected to said third n-body and an input node is connected to said second n-body.

17. A method for operating a charge pump formed on a silicon-on-insulator (SOI) substrate, said charge pump comprising:
a substrate;
an insulator formed on said substrate;
a semiconductor layer formed on said insulator;
a first p-body formed in said semiconductor layer;
a second p-body formed in said semiconductor layer;
a n+ region formed in said semiconductor layer extending down to said insulator, said n+ region separating said first p-body and said second p-body; and
a gate structure formed atop a portion of said first p-body and only a portion of said n+ region, said gate structure over said first p-body and said n+ region forming a switch, said n+ region and said first p-body forming a first diode, said n+ region and said second p-body forming a second diode, said gate structure formed from a thin gate oxide layer underneath a conductive layer;
said method comprising:
applying an input signal to said second p-body;
applying a clock signal to said gate structure; and
obtaining an output signal at said first p-body, said output signal a result of the generation of a gate induced drain leakage (GIDL) current operating on said charge pump.

18. The method of claim 17 wherein said clock signal is a periodic pulse.

19. A method for operating a charge pump formed on a silicon-on-insulator (SOI) substrate, said charge pump comprising:
a substrate;
an insulator formed on said substrate;
a semiconductor layer formed on said insulator;
a first p-body formed in said semiconductor layer;
a second p-body formed in said semiconductor layer;
a n+ region formed in said semiconductor layer extending down to said insulator, said n+ region separating said first p-body and said second p-body;
a gate structure formed atop a portion of said first p-body and only a portion of said n+ region, said gate structure over said first p-body and said n+ region forming a half transistor, said gate structure formed from a thin gate oxide layer underneath a conductive layer;
a second n+ region formed in said semiconductor layer and extending down to said insulator, said second n+ region being positioned so that said first p-body is between said n+ region and said second n+ region;
a third p-body formed in said semiconductor layer and extending down to said insulator, said third p-body being positioned so that said second n+ region is between said first p-body and said third p-body; and a second gate structure formed atop a portion of said third p-body and a portion of said second n+ region, said gate structure formed from a second thin gate oxide layer underneath a second conductive layer;

said method comprising:
  applying an input signal to said second p-body;
  applying a first clock signal to said gate structure;
  applying a second clock signal to said second gate structure; and
  obtaining an output signal at said third p-body, said output signal a result of the generation of a gate induced drain leakage (GIDL) current operating on said charge pump.

20. The method of claim 19 wherein said first clock signal and said second clock signal are out of phase with each other.

* * * * *

UNITED STATES PATENT AND TRADEMARK OFFICE
CERTIFICATE OF CORRECTION

PATENT NO.      : 6,552,397 B1                                Page 1 of 1
DATED           : April 22, 2003
INVENTOR(S)     : Chi It is certified that error appears in the above-identified patent and that said Letters Patent is hereby corrected as shown below:

<u>Column 6,</u>
Line 57-58, please delete "half transistor" and insert -- switch --.
Line 58, please insert -- said n+ region and said first p- body forming a first diode, said n+ region and said second p- body forming a second diode --.

Signed and Sealed this

Fourth Day of May, 2004

JON W. DUDAS
*Acting Director of the United States Patent and Trademark Office*